(12) United States Patent
Murphy

(10) Patent No.: US 6,559,788 B1
(45) Date of Patent: May 6, 2003

(54) PARALLEL AND SHARED PARALLEL ANALOG-TO-DIGITAL CONVERSION FOR DIGITAL IMAGING

(76) Inventor: Charles Douglas Murphy, 1816 W. Wilson Ave., #3, Chicago, IL (US) 60640

( * ) Notice: Subject to any disclaimer, the term of this patent is extended or adjusted under 35 U.S.C. 154(b) by 0 days.

(21) Appl. No.: 10/073,385

(22) Filed: Feb. 12, 2002

(51) Int. Cl.⁷ .............................................. H03M 1/12
(52) U.S. Cl. ..................... 341/164; 341/166; 341/158
(58) Field of Search ................................ 341/158, 161, 341/162, 163, 164, 165, 166, 169

(56) References Cited

U.S. PATENT DOCUMENTS

| | | | | |
|---|---|---|---|---|
| 3,781,871 A | * | 12/1973 | Mattern | 341/136 |
| 4,034,367 A | * | 7/1977 | Sugiyama et al. | 341/131 |
| 4,118,698 A | * | 10/1978 | Becker | 341/120 |
| 4,127,810 A | * | 11/1978 | Purland | 324/99 D |
| 4,191,942 A | * | 3/1980 | Long | 341/124 |
| 4,214,234 A | * | 7/1980 | Cunningham, Jr. et al. | 341/118 |
| 4,291,297 A | * | 9/1981 | Kanemaru et al. | 341/169 |
| 4,963,875 A | * | 10/1990 | Yatsuzuka | 341/164 |
| 5,084,704 A | * | 1/1992 | Parrish | 341/164 |
| 5,831,568 A | * | 11/1998 | Mohr | 341/166 |
| 6,020,840 A | * | 2/2000 | Ong | 341/155 |
| 6,087,970 A | | 7/2000 | Panicacci | |
| 6,094,153 A | | 7/2000 | Rumsey et al. | |
| 6,184,721 B1 | | 2/2001 | Krymski | |
| 6,204,795 B1 | * | 3/2001 | Afghahi | 341/166 |
| 6,215,434 B1 | | 4/2001 | Roza | |
| 6,248,991 B1 | | 6/2001 | Chen et al. | |
| 6,249,618 B1 | | 6/2001 | Hou | |
| 6,271,785 B1 | | 8/2001 | Martin et al. | |
| 6,289,139 B1 | | 9/2001 | Chen et al. | |
| 6,295,013 B1 | | 9/2001 | Barna et al. | |
| 6,310,571 B1 | * | 10/2001 | Yang et al. | 341/155 |
| 6,329,233 B1 | | 12/2001 | Pan et al. | |

OTHER PUBLICATIONS

Paul Horowitz and Winfield Hill, The Art of Electronics, Second edition 1994, Cambridge University Press, New York. pp. 621–641.

* cited by examiner

Primary Examiner—Howard L. Williams

(57) ABSTRACT

A machine used for acquisition of digital images. A counter tracks the elapsed time since the beginning of image acquisition. When an analog sensor output changes by a pre-set amount, the count is stored as the digital number value representing the sensor output. This eliminates the need for a traditional analog-to-digital (A/D) conversion of the sensor output. In an array of sensors, the circuitry of the invention is simple enough to enable massively parallel A/D conversion. The invention can be implemented in an array using a separate counter for each sensor, but it is also possible to reduce costs by sharing counters among the sensors.

40 Claims, 2 Drawing Sheets

PARALLEL AND SHARED PARALLEL ANALOG-TO-DIGITAL CONVERSION FOR DIGITAL IMAGING

BACKGROUND

Description of Prior Art

A digital image is often acquired using an array of sensors. At the beginning of image acquisition, the sensors are initialized to known states, and then exposed to incident energy. During the exposure time, the sensors respond to incident energy by changing a sensor parameter. Possible variable sensor parameters include electrical, chemical, and optical properties.

Two important digital imaging technologies are charge-coupled device (CCD) arrays and CMOS image sensor arrays. In both of these technologies, the sensor parameters that change in response to incident energy are electrical, either voltage levels or current levels.

CCD array technology is older than CMOS sensor array technology. Typically, the CCD sensors are fabricated in a rectangular array comprising rows and columns. The various CCD sensors acquire differing amounts of charge in response to differing amounts of incident energy. At the end of the exposure time, the charge values along one edge of the array are passed to circuitry that performs analog-to-digital (A/D) conversion. The charge stored in the remainder of the array is physically shifted by one sensor row or column towards the edge. The new charge values occupying the readout edge of the array are passed to circuitry that performs A/D conversion. The whole process is repeated as many times as necessary.

There are three potential problems with CCD array technologies that are related to A/D conversion. One is that the manufacturing technology does not permit easy incorporation of circuitry other than the CCD array on the CCD array chip. Thus, the charge values must be passed to another chip to undergo A/D conversion.

A second problem is that it is not practical to perform simultaneous A/D conversion. Only a small set of charge values is available during each iteration of the charge transfer process. While it would be possible to wait for all the charge values to be transferred before beginning A/D conversion, doing so would delay production of the final digital image.

A third problem is that once the various charges have been accumulated, they must be successively shifted to the edge of the array and sent to processing circuitry before the CCD array can be used to acquire another image.

CMOS image sensor arrays represent a newer technology than CCD arrays. A CMOS image sensor responds to incident energy by changing an electrical parameter such as a voltage or a current. The main advantage of a CMOS image sensor array over a CCD array is that CMOS manufacturing techniques readily accommodate circuitry other than the sensors on the same chip as the sensors. If the circuitry is located far from the sensor array on the same chip, the fill factor of the array can be quite high. On the other hand, if the circuitry is located close to the sensors, for instance, in the structure of the array itself, the fill factor of the array may be reduced.

With a CMOS image sensor array, it may be possible to implement simultaneous A/D conversion of the sensor output levels. Also, it may be possible to remove the sensor output levels from the array without having to transport one row (or column) physically to the sensors of another row (or column). Thus, CMOS image sensor arrays may permit fast processing of images once they have been acquired.

In prior art digital imaging systems, the variations in the incident energy reaching different sensors in an array are translated to variations in analog sensor outputs which are voltages or currents. All of the analog outputs must be converted to digital number values. This requires an A/D converter.

Several prior-art A/D converters have been used for digital imaging. A flash A/D converter compares an analog input to a set of analog reference levels, and decodes the comparator results to produce a digital output number. Flash converters are very fast, but can be costly, since the number of converters increases exponentially with the number of bits in the digital output numbers.

A successive approximation A/D converter performs a search for the right digital output number by comparing the analog input to a series of reference levels generated with a digital-to-analog converter. Since a binary search requires as many iterations as bits, A/D converters using successive approximation are slower than flash converters. Moreover, as the number of bits of precision increases, successive approximation conversion becomes even slower.

Depending on available chip space and other resources, one or more A/D converters can be used to process analog sensor output levels from CCD or CMOS image sensor arrays. Since there are often a large number of sensors, a large number of A/D conversions must be performed. Even if some A/D conversions occur in parallel, they usually function separately from one another.

Many users of digital cameras are familiar with the relatively long lag time between acquisition of one image and being ready to acquire a second image. Much of this time is devoted to A/D conversion and storage of the resulting digital numbers. Unfortunately, faster A/D conversion usually requires additional chip space and consumed power. It would be desirable to have a fast, low-cost alternative to traditional A/D conversion in digital image acquisition.

SUMMARY

The present invention is a digital imaging technique in which a counter indicates elapsed exposure time, and sensors trigger recording of the count when their respective sensor output level reaches pre-set threshold levels, thus permitting parallel A/D conversion with shared circuitry.

OBJECTS AND OBJECTIVES

There are several objects and objectives of the present invention.

It is an object of the present invention to allow digital image acquisition without the use of prior art A/D conversion techniques such as flash conversion or successive approximation.

It is an object of the present invention to allow digital image acquisition in which A/D conversions are completed upon reaching a specified exposure duration, rather than delaying conversion until after the specified exposure time.

It is an object of the present invention to allow digital image acquisition in which A/D conversion occur in parallel.

It is another object of the present invention to reduce the cost of the A/D conversion by sharing circuitry among multiple converters operating simultaneously.

It is another object of the present invention to enable simple circuitry for each sensor output conversion so that it is possible to create a standard block including a sensor and associated conversion circuitry. The standard block can be replicated to create an array, and would be particularly useful in CMOS imaging sensor array technology.

Further objects and advantages of the invention will become apparent from a consideration of the ensuing description.

DRAWING FIGURES

In the drawings, closely related figures have the same number but different alphabetic suffixes.

Figure 1:
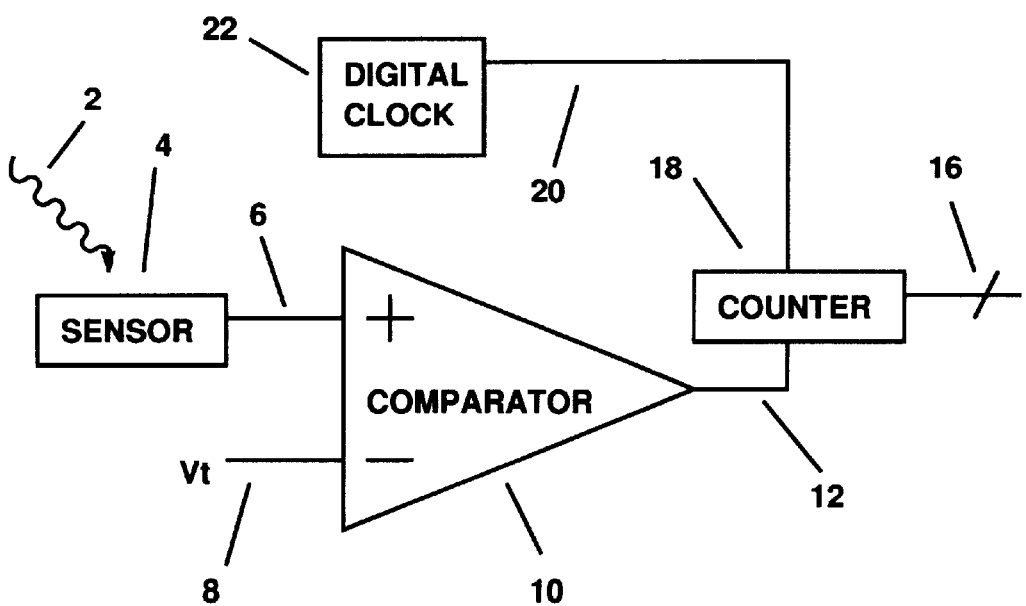
FIG. 1 shows an embodiment of the invention with a digital clock, a counter, a comparator, and a digital register for converting the output of a sensor to a digital number value.

REFERENCE NUMERALS IN DRAWINGS 2 incident energy
4 a first sensor
6 a first sensor output
8 a first threshold level
10 a first comparator
12 a first comparator output
14 a first digital register
16 a first counter output
18 a first counter
20 a first digital clock signal
22 a first digital clock
23 incident energy
24 a second sensor
26 a second sensor output
28 a second threshold level
30 a second comparator
32 a second comparator output
34 a second digital register

DESCRIPTION—DIGITAL IMAGING AND A/D CONVERSION

A digital imaging system includes an array of sensors that respond to incident energy by changing a parameter such as an electrical, an optical, or a chemical property. The parameters that change are analog parameters, but the desired image is digital. Thus, measurements of the parameter changes are operated on by an analog-to-digital (A/D) converter. Each analog parameter or parameter change is recorded as a digital number value. The set of digital number values from the sensor array is the acquired digital image. The information content of the image depends on having digital number values whose differences accurately reflect the different amounts of energy incident on the sensors in the array.

The A/D converters used in most digital imaging systems accept one analog output and produce one digital output which is a member of a finite set of digital outputs. Important features of these A/D converters include minimum conversion levels, maximum conversion levels, number mappings, and precision.

The number mapping of an A/D converter determines how analog inputs are mapped to digital output numbers. All analog input levels which are less than the minimum conversion level are assigned to the smallest digital output number. All analog input levels which are greater than the maximum conversion level are assigned to the largest digital output number.

The minimum conversion level and the maximum conversion level determine the dynamic range of an A/D converter. If possible, analog inputs to an A/D converter should be less than the maximum conversion level and greater than the minimum conversion level. An A/D converter cannot accurately represent differences in inputs that are outside the dynamic range.

A common number mapping in A/D converters is the uniform mapping, though of course other number mappings are possible. In a uniform mapping, each digital output number other than the smallest digital output number and the largest digital output number corresponds to a continuous range of analog inputs. The ranges or bins assigned to the intermediate digital output numbers have the same size.

The precision of an A/D converter is usually measured by the number of digital representation elements, such as bits, that are available for the converter's digital output. For instance, there are 8-bit A/D converters and 22-bit A/D converters. An 8-bit A/D converter can produce a total of $2^8$ or 256 possible outputs, while a 22-bit A/D converter can produce a total of $2^{22}$ or 4194304 possible outputs. With 256 possible outputs, an 8-bit A/D converter is often considered to have low precision, whereas with more than 4 million outputs, a 22-bit A/D converter is often considered to have high precision.

The actual resolution of an A/D converter depends on the number mapping, the precision, the dynamic range, and the range of the analog input levels. An A/D converter is not very useful when analog input levels are routinely less than the minimum conversion level or greater than the maximum conversion level. Also, an A/D converter is not very useful when the analog signal levels have a much smaller range than the dynamic range. For instance, an A/D converter cannot capture differences in analog signal levels that are all in a single mapping bin.

DESCRIPTION—PRIOR ART A/D CONVERTERS

There are many prior art examples of A/D converters. The following description includes discussion of seven A/D conversion techniques along with listing of advantages and disadvantages of each. The discussion is based on material in the second edition of "The Art of Electronics" by P. Horowitz and W. Hill.

Parallel or flash conversion is a very fast A/D conversion technique. In a flash converter, an analog input is simultaneously applied as an input to a set of comparators. A comparator is a device which has a high output signal or a low output signal depending on the sign of the difference between two inputs. In the flash converter, each comparator has one input set to a reference level. Based on the outputs of the various comparators with their various reference levels, a digital encoder produces the flash converter's digital output number.

While a flash converter is fast, it is also very costly, particularly as the number of bits of precision increases. This is because the number of comparators and references levels increases as the number of possible output levels. For instance, an 8-bit flash converter would require 256 comparators, while a 22-bit flash converter would require more than 4 million converters.

A/D conversion by successive approximation replaces the all-at-once comparison of flash conversion with a search through the possible digital outputs. An efficient way to implement successive approximation is to compare an analog input to a reference level at the midpoint of the dynamic range. The first comparison determines whether the analog input is greater than or less than this first reference level. In successive cycles, further comparisons can use smaller ranges, until a final approximation is reached.

A/D conversion by successive approximation requires reduced numbers of comparison operations relative to flash conversion. However, successive approximation requires more time. Specifically, successive approximation requires one iteration per bit of precision. Also, producing the variable reference levels requires a digital-to-analog converter.

In voltage-to-frequency conversion, the converter produces a current proportional to an analog input which is a voltage. The current charges a capacitor, which is discharged when it reaches a threshold voltage level. With a higher voltage, there is a higher proportional current, so the capacitor charges more quickly, and the frequency of the capacitor waveform increases.

According to the authors of "The Art of Electronics", with voltage-to-frequency converters one "can get a digital count proportional to the average input level by counting the output frequency for a fixed time interval", a technique which is used in some digital panel meters.

A/D conversion by single-slope integration involves an analog input voltage applied to one input of a comparator. A constant current source generates a voltage ramp by charging a capacitor connected to the other input of the comparator. When the voltage ramp begins, a counter begins to count pulses from a stable clock. When the voltage ramp reaches the level of the analog input voltage, the comparator causes the counter to stop.

A/D conversion with single-slope integration requires a capacitor and a comparator that are stable and accurate in order to provide an accurate output. On the other hand, A/D conversion with dual-slope integration is relatively immune to stability of the capacitor, the comparator, and the clock.

In A/D conversion using dual-slope integration, a current proportional to an analog input level charges a capacitor for a fixed amount of time. Subsequently, a known constant current discharges the same capacitor. At the start of the discharge, a counter is enabled and counts pulses from a digital clock. When the capacitor is fully discharged, the count is recorded. The voltage at the start of the discharge is proportional to the analog input level, which means that the time required to discharge using a constant current is also proportional to the analog input level.

In A/D conversion with a delta-sigma converter, an analog input voltage is applied to an integrator. The integrator is a comparator with a non-inverting input connected to a reference voltage and capacitor connecting the comparator output to the inverting input. The input voltage is connected to the inverting input through a resistor. The comparator output is used to drive a circuit that switches a pulsed current source between a ground connection and a connection to the inverting input of the comparator. The conversion involves counting the number of pulses applied to the inverting input during a fixed number of pulse intervals.

Switched-capacitor A/D conversion is similar to delta-sigma conversion. In switched-capacitor A/D conversion, a capacitor is charged to a precise reference voltage, and then discharged into the summing junction (i.e. the inverting input of an integrator's comparator). The comparator output governs how frequently the capacitor is charged and discharged. A count of the number of times the capacitor is charged and discharged in a given time interval provides the A/D converter's digital output.

Dual-slope converters and charge balancing converters—those based on delta-sigma or switched-capacitor techniques—are mainly used for high-precision A/D conversion. Dual-slope and multi-slope conversion techniques are precise, but quite slow. Charge-balancing techniques are precise and faster than dual-slope and multi-slope converters. However, both types of converters are much slower than successive-approximation and flash converters.

DESCRIPTION—SPECIAL FEATURES OF DIGITAL IMAGE ACQUISITION

Digital imaging systems have several unique features which dictate which A/D converters can be used for digital imaging and how those A/D converters are used.

Digital imaging systems uses arrays of sensors. Digital cameras available to average consumers may include an array of 1200 by 1700 sensors. Acquiring an image with this camera requires 2040000 A/D conversion operations. Clearly, a slow A/D converter should not be used if there is to be a very short delay between acquisition of one image and readiness to acquire another image.

As circuit manufacturing techniques improve, it is certainly possible that consumer and high-end digital imaging systems will include larger sensor arrays. At the high end, for instance, one might be able to build an ultra-high resolution digital video camera similar to the prior art analog IMAX camera.

As mentioned above, a CCD array, which is commonly used in digital imaging, provides sensor outputs one row or column at a time. Ordinarily the available outputs at any given time are passed to A/D converter circuitry on a separate chip from that of the CCD array. Naturally, it is possible to convert the various analog outputs to digital numbers sequentially. However, in addition to series conversion, it is possible to use parallel conversion.

In parallel conversion, two or more analog inputs are simultaneously converted to digital output numbers. Consider, for instance, 100 separate A/D converters used in parallel to convert the 2040000 outputs of a 1200 by 1700 sensor array. If each could perform 20400 conversions per second, then altogether they would require one second to convert all of the sensor outputs. If there were just one such A/D converter, it would require 100 seconds to convert all of the sensor outputs.

The benefit of having parallel A/D converters is a reduction in the time required to complete all the conversions required for acquisition of a digital image. The cost of the conversions may be reduced. For example, if system specifications require 2040000 array outputs to be converted in no more than one second, 100 A/D converters with a rate of 20400 conversions per second might have lower cost than a single extremely fast A/D converter that can perform 2040000 conversions per second.

On the other hand, using parallel A/D converters may increase the cost of the conversions. For example, 100 A/D converters implemented on a chip might require a large amount of chip space and might consume a large amount of power.

As mentioned earlier, an important advantage of CMOS image sensor arrays over CCD arrays is that circuitry other than the sensor elements can easily be fabricated on the same chip as the sensor elements themselves. Also, a CMOS image sensor array does not require repeated transfer of the sensor measurements across the array in order to access them for A/D conversion.

In CMOS image sensor arrays, processing circuitry for a sensor can be located physically adjacent to that sensor. However, this may result in a reduction of the "fill factor" of the array. The fill factor is a measure of how much of the total area of the array is available for sensor elements. The processing circuitry is not itself responsive to incident energy, so space it uses on the chip may reduce the space available to the responsive sensor elements.

CMOS image sensor arrays offer the possibility of massively parallel A/D conversion. However, the A/D circuitry for massively parallel conversion should be co-located with the sensors in order to minimize requirements for routing wires connecting sensor elements and converters, and should have small size so that the fill factor of the sensor array remains high.

DESCRIPTION—THE PREFERRED EMBODIMENT OF THE INVENTION

The preferred embodiment of the present invention as described in claim 1 is a machine used for digital image acquisition, comprising a first counter which provides a first count and a first sensor which provides a first sensor output signal. The preferred embodiment includes means for causing the first count to change as a function of time and means for generating a first sensor output signal level change. The preferred embodiment also includes means for detecting when the first sensor output signal level change reaches a first threshold level, and means for measuring a first elapsed count of the first count which is indicative of the time required for the first sensor output signal level change to reach the first threshold level.

In other words, the preferred embodiment of the invention measures the time required for the first sensor output signal level to change by an amount equal to the first threshold level. The first counter keeps track of time via the first count, which might increase with time or which might decrease with time. The means for generating a first sensor output signal level might involve exposing the first sensor to incident energy in the form of visible light, non-visible electromagnetic radiation, or sound. However, the sensor may use other modalities than optical, electronic, optoelectronic, or electromechanical sensing. For instance, the sensor could produce a chemical reaction.

The means for detecting compares the output signal level change during an exposure time to the first threshold level. When the first threshold level is reached, the measuring means is used to determine a first elapsed count. This count reflects the time between the start of the exposure and the reaching of the first threshold level.

If the value of the first count at the start of the sensor exposure is zero, then the time to reach the threshold level is simply the value of the first count upon reaching the threshold level. If the value of the first count at the start of the sensor exposure is not zero, but a first initial count value, then the time to reach the threshold level is the difference between the threshold count and the first count value. Note that in digital counting, there is the possibility of overflow. Differential counting which takes into account the possibility of no more than one overflow event can be used to obtain a full count range regardless of the starting value of the first count.

The preferred embodiment of the invention is similar to A/D conversion via single-slope integration. However, unlike single-slope integration, the present invention does not require an analog input voltage which is sampled and held, with the held value compared to the voltage across a reference capacitor that is charged up by a known reference current source. Instead, the present invention exploits the fact that sensors used in digital imaging often provide a monotonic output that at any given time is proportional to the integrated response to incident energy or chemical change since a beginning of an exposure time. Much of the circuitry in single-slope integration A/D converters can be replaced with low-cost alternatives.

DESCRIPTION—ALTERNATIVE EMBODIMENTS WITH DIGITAL CLOCKS

There are many alternative embodiments of the invention. Of particular interest are embodiments that require simple circuitry, embodiments that share circuitry, and embodiments that reduce power consumption.

In an alternative embodiment of the invention, the first counter is governed by a first digital clock signal. The clock signal produces pulses which cause the count to increment. Digital clock signals of various frequencies are easily generated using various prior art technologies.

With a fixed frequency of, for instance, 500 MHz, the first digital clock signal can cause the first counter to increment 500000 times during an exposure time of 0.001 second. This permits a precision of 18 bits during the exposure time. On the other hand, with a fixed frequency of 5 MHz during the same exposure time, the digital clock can cause the counter to increment 5000 times, permitting a precision of 12 bits during the exposure time.

In another alternative embodiment of the invention, a first digital clock signal with a variable frequency governs the first counter. Typically, one would not want the first digital clock frequency to vary during an individual measurement of the time required for the first sensor output signal level change to reach the first threshold level. However, one might want to re-use the same sensor circuitry in a variety of different conditions, so a digital clock that could have several different frequencies would be useful.

For instance, with two possible frequencies—500 MHz and 5 MHz—the first digital clock could provide 18-bit precision or 12-bit precision during a maximum exposure time of 0.001 second. Alternatively, the same two frequencies allow 18-bit precision with an exposure time of 0.001 second or 18-bit precision with an exposure time of 0.1 second.

Having several possible digital clock frequencies allows variable conversion precision during a fixed exposure time, and also allows various exposure times. Frequencies that are relatively low are useful for long exposure times in low-light conditions, when the first sensor output signal level change may be very slow. Frequencies that are relatively high are useful for short exposure times in bright conditions, when the first sensor output signal level change may be very fast. Note that while "low-light" and "bright" may refer directly to visible light conditions, similar conditions leading to slow or fast sensor output signal level changes exist for non-visible electromagnetic radiation, pressure waves, and chemical reaction sensors.

Since in CMOS technology, the power consumed by digital circuitry depends on the clock rate, a variable frequency digital clock signal can be used to reduce the power consumption of the first counter to the level needed, and not more.

DESCRIPTION—ALTERNATIVE EMBODIMENTS WITH COMPARATORS

In an alternative embodiment of the invention, the means for generating the first sensor output signal level change includes means for initializing the first sensor output signal to a known initial first sensor output signal level. A clear choice for the known initial first sensor output signal level is zero. For instance, if the first sensor output signal is a voltage, the first sensor output signal level could be initialized to zero volts, the potential of a local ground. Then, the first sensor output signal level change is simply the first sensor output signal level during the exposure time.

In another alternative embodiment with the zero level sensor initialization, the means for detecting when the first sensor output signal level change reaches the first threshold is a first comparator. One input of the first comparator can be the first sensor output signal, and the other input can be the first threshold level.

A comparator is a very simple device that is similar to an operational amplifier and that compares two inputs. If one input, termed the non-inverting input, is greater than the other input, which is the inverting input, then the comparator output is a "high" signal near the comparator's upper power supply voltage. If the non-inverting input is less than the inverting input, then the comparator output is a "low" signal near the comparator's lower power supply voltage. The inputs of a comparator can be analog signals, while the output can be used to govern digital circuits.

In another alternative embodiment with non-zero sensor initialization, a first comparator with the first sensor output signal as one input and the first threshold level as a second input can be used as the means for detecting when the first sensor output signal level change reaches the first threshold level. In this case, the first threshold level represents a desired level of change as well as the non-zero initial value of the first sensor output signal level.

The first threshold level can be a function of a first sensor output signal level when there is no initialization of the first sensor output signal level. Such an embodiment of the invention would be particularly useful in differential measurement of the first sensor output signal level. For instance, one might want to acquire multiple measurements without multiple initializations of the first sensor output signal level. The sensor response might have a large linear range, while the desired threshold level might have a relatively small value. In this case, embodiments of the invention could include some form of common mode rejection with the first threshold level equal to a desired threshold level added to the sensor output signal at the start of a measurement compared to the sensor output signal level during the measurement time.

Other possible alternative embodiments of the invention in which the detecting means include a comparator may have various forms of offset, addition, subtraction, or signal gain implemented with circuitry such as op-amps and current or voltage sources feeding into summing junctions. There are many ways that a comparator can be used for the detecting means, but the simplest way seems to be to have a voltage corresponding to the first threshold level applied to one comparator input and a voltage corresponding to the first sensor output signal level change to the other comparator input.

DESCRIPTION—ALTERNATIVE EMBODIMENTS WITH COUNTER INITIALIZATION AND RECORDING

The means for measuring the first elapsed count should consider the value of the first count when the first sensor output signal level change reaches the first threshold level, but it must also consider the value of the first count at the beginning of the time during which the first sensor output signal level changes.

In one alternative embodiment, the means for measuring the first elapsed count comprises means for initializing the value of the first count to a first initial count and means for recording the value of the first count as a first final count when the first sensor output signal level change reaches the first threshold level. One possible value of the first initial count is zero, in which case the first elapsed count is just the value of the first final count.

The first final count can be stored in a first digital register. The register acquires the first count value when instructed, and holds it. The first count can continue to change as a function of time, which is useful if it provides the first count to more than one sensor output conversion circuit. The first final count can also be acquired by disabling the first counter so that it no longer changes as a function of time. However, this implies that the first counter is dedicated for use with the first sensor only and is not a circuit shared among parallel converters.

In still another alternative embodiment of the invention, the means for measuring the first elapsed count includes means for recording the value of the first count as a first initial count before the first sensor output signal level change is generated. Since the first count must change as a function of time in order to produce the first final count, the recording of the first initial count should use a digital register.

DESCRIPTION—ALTERNATIVE EMBODIMENTS WITH MULTIPLE SENSORS

An alternative embodiment of the invention includes a second sensor which provides a second sensor output signal, means for generating a second sensor output signal level change, means for detecting when the second sensor output signal level change reaches a second threshold level, and means for measuring a second elapsed count.

The embodiment uses the first count provided by the first counter for determining the first elapsed count and for determining the second elapsed count. Thus, the circuitry of the first counter is shared between the conversion circuitry of the first sensor and the conversion circuitry of the second sensor. While this seems like a minor cost reduction, consider that there might be two million or more sensors. It may be possible to have a single counter instead of two million counters. This may result in a large reduction in the chip space required for conversion circuitry and also a large reduction in the power consumed, especially at high counting speeds.

In an alternative embodiment of the invention with two sensors that share one counter, the means for generating the first sensor output signal level change includes means for initializing the first sensor output signal level to a known initial first sensor output signal level, and the means for generating the second sensor output signal level change includes means for initializing the second sensor output signal level to a known initial second sensor output signal level. The two initial signal levels can be the same level.

In an alternative embodiment of the invention with two sensors that share one counter, the first threshold level and the second threshold level are the same level.

In another alternative embodiment, the means for detecting when the first sensor output signal level change reaches the first threshold includes a first comparator and the means for detecting when the second sensor output signal level change reaches the second threshold includes a second comparator.

In still another alternative embodiment, the means for measuring the first elapsed count comprises first means for recording the value of the first count when the first sensor output signal level change reaches the first threshold level and second means for recording the value of the first count when the second sensor output signal level change reaches the second threshold level. Both recording means can be digital registers.

According to these embodiments of the invention, different sensors with approximately the same physical characteristics can have conversion circuitry in which non-shared parts have identical construction. This is very important in the context of large arrays. A single sensor with non-shared conversion circuitry can be designed, and then replicated to create a sensor array. Subsequently, shared circuitry and signal routing and control paths can be added with little additional effort.

When using one counter as a piece of circuitry shared among two or more sensors and their separate conversion circuitry, there may be different signal routes between the counter and the various count recording means of the various sensors. It may be desirable to compensate for routing delays.

For instance, the counter might be located physically near a sensor on one edge of a sensor array, but used by another sensor on the other side of the array. The counter signal might propagate a short distance to the first sensor's recording means, but a long distance to the second sensor's recording means. Due to the difference in distance and also to the response time of intermediate signal buffers or line drivers, the count signal at one sensor may not be the same as the count signal at the other sensor, particularly at very high counting speeds.

There are several ways to compensate for routing delays. One natural way is to record an initial first count and a final first count with recording means close to a first sensor, and to record an initial second count and a final second count with recording means close to a second sensor. Even if simultaneous initial recordings and simultaneous final recordings produce different count values, elapsed count values derived from the differences between final and initial counts can eliminate the offset. Note, however, that this method requires two recording means for each sensor's local conversion circuitry, and subtraction to produce the elapsed counts.

An alternative method is to measure the relative propagation delays precisely and provide separate means for subtracting out offsets due to the delays. The advantage of this is that the a single set of final counts can be transported elsewhere than the sensor array itself and processed using circuitry that does not reduce the fill factor of the array. Each sensor can have an associated compensation count that is added to or subtracted from the measured final counts.

DESCRIPTION—ALTERNATIVE EMBODIMENTS WITH MULTIPLE COUNTERS

Alternative embodiments of the invention can have a second sensor which provides a second sensor output signal and a second counter which provides a second count used to measure when a second sensor output signal level change reaches a second threshold level. In other words, a sensor array need not have only one counter. Each counter might be shared among two or more sensors, or might be part of the non-shared circuitry of a single sensor's conversion circuitry.

The means for causing a first counter and a second counter to change as a function of time might be a single digital clock signal. Alternatively, each counter might have its own governing digital clock signal. The single digital clock signal might be variable. Multiple digital clock signals might be variable, but required to have a common frequency at any given time. Multiple digital clock signals might be variable, but allowed to have different frequencies at any given time. For instance, one might use a 5 MHz clock for some elements of a sensor array and a 500 MHz clock for others. Then it would be possible to acquire digital images with a short exposure time and digital images with a long exposure time simultaneously. This might eliminate the need for exposure time selection prior to or during image acquisition.

As with a single counter shared among multiple sensors, when there are two counters which may or may not be shared among multiple sensors, there can be signal propagation delays such that one counter does not have count values identical to another counter at any given time and such that count values at differing sensor locations are not identical at any given time. Thus, compensation for delays and differences may be desired.

One compensation technique is to record initial and final counts locally for each sensor, and to generate elapsed counts via subtraction. Alternatively, one can measure propagation delays and count differences precisely, and add or subtract compensation counts from measured final counts. A third possibility is to initialize different counters to different values. When the counters are shared, different initialization values can compensate for delays in triggering the start of counting, such as routing delays of governing digital clock signals. However, additional compensation may be needed to compensate for count signal routing delays. When the counters are not shared, but local and exclusive to individual sensors conversion circuitry, different initialization values can fully compensate for routing delays.

DESCRIPTION—FIG. 1 AND NON-SHARED COUNTERS

FIG. 1 shows a simple, practical embodiment of the invention which incorporates aspects of several claims. The embodiment is simple in that relatively few circuit elements are required for A/D conversion. All of these are included in the figure, along with the basic connections required to make them function.

In FIG. 1, incident energy 2 reaches a first sensor 4. The incident energy 2 could be visible light, non-visible electromagnetic radiation, or acoustic energy, for instance. However, the energy could also be from a chemical reaction at or near the sensor surface. First sensor 4 has a first sensor output 6 which is an analog voltage applied to the non-inverting input of a first comparator 10. A first threshold level 8 which is also an analog voltage, Vt, is applied to the inverting input of first comparator 10.

First comparator 10 has a first comparator output 12 which has a digital "high" value when first sensor output 6 is greater than first threshold level 8, and which has a digital "low" value when first sensor output 6 is less than first threshold level 8. If, prior to exposure to incident energy 2, first sensor output 6 is initialized to zero volts, then the value first sensor output 6 during the exposure time is equal to the first sensor output signal level change. Supposing that first sensor output 6 does not decrease in response to incident energy 2, and Vt, the first threshold level 8 is a positive voltage, then first comparator output 12 will be a digital "low" until such time as first sensor output 6 reaches first threshold level 8, after which first comparator output 12 will be a digital "high".

First comparator output 12 is a digital signal which changes from "low" to "high" when first sensor output 6 reaches first threshold level 8. Thus it is a detector which indicates when first threshold level 8 is reached. First comparator output 12 is one control signal for a first counter 18. On the transition of first comparator output 12 from "low" to "high", first counter 18 is disabled, so that whatever value first counter output 16 has is held or recorded. In the figure, first counter output 16 has a slash indicating that it may comprise several parallel digital wires.

In a full acquisition cycle, first sensor output 6 is initialized to zero and first counter 18 is initialized to zero so that first counter output 16 is equal to zero. Then, first sensor 4 is exposed to incident energy 2 and digital clock 22 provides digital clock signal 20 with a given frequency. Digital clock signal 20 causes first counter 18 to increment the value of first counter output 16. When first sensor output 6 exceeds first threshold level 8, first comparator output 12 disables first counter 18.

For FIG. 1, there are several assumptions that are useful but not necessary to proper functioning of the invention. First sensor output 6 was assumed to be non-decreasing. It could well decrease from a voltage larger than first threshold level 8, resulting in first comparator output 12 going from a digital "high" level to a digital "low" level. It was also assumed that first comparator output 12 disabled first counter 18 by going from digital "low" to digital "high". The disable control trigger could easily be a transition from digital "high" to digital "low".

In a CMOS implementation, it is possible to fabricate sensors and supporting circuitry in close proximity on the same chip. In the context of an array, the parts in FIG. 1 that are unique to first sensor 4 are first counter 18, first comparator 10, and possibly a reference source for first threshold level 8. These few parts can easily be fabricated near first sensor 4. First counter output 16 would probably be asserted on a shared bus, in which case first counter 18 must be able to tri-state its outputs and must have an output control line in addition to the connection which delivers first digital clock signal 20. Also, it may require one or two control lines—possibly shared with other counters—to trigger initialization and the start of counting.

For purposes of comparison, a 1200 by 1700 element sensor array employing the embodiment of the invention in FIG. 1 would require 2040000 comparators, 2040000 counters, and up to 2040000 threshold reference sources. While it would be possible to have a single digital clock providing a single digital clock signal, it is likely that each digital clock signal would drive far fewer than 2040000 counters. There would probably be a single master clock, however, driving a tree of clock buffers, with multiple resulting digital clock signals.

With respect to stability requirements, a sensor array may comprise a large number of sensors fabricated simultaneously on a single chip. The sensors themselves exhibit variations in physical parameters which cannot be corrected by highly-stable precise A/D converters on their own. However, it is envisioned that if it is possible to manufacture sensors with desired parameter tolerances, small, simple devices such as voltage sources and comparators can be manufactured on the same chip with the same manufacturing process with similar tolerances. In other words, precision sensor fabrication should allow precision conversion circuitry fabrication.

DESCRIPTION—FIG. 2 AND SHARED COUNTERS

As was mentioned earlier, in CMOS technologies, power is consumed when digital circuits switch states. In a sensor array, it may not be desirable to have a dedicated counter for each sensor. For instance, with a 1200 by 1700 element array, 2040000 dedicated counters might consume a fairly large amount of power.

Also, dynamic power consumption of digital logic is proportional to the switching speed, so with a 500 MHz digital clock signal a counter has approximately 100 times the dynamic power consumption of the same counter driven by a 5 MHz digital clock signal.

Figure 2:
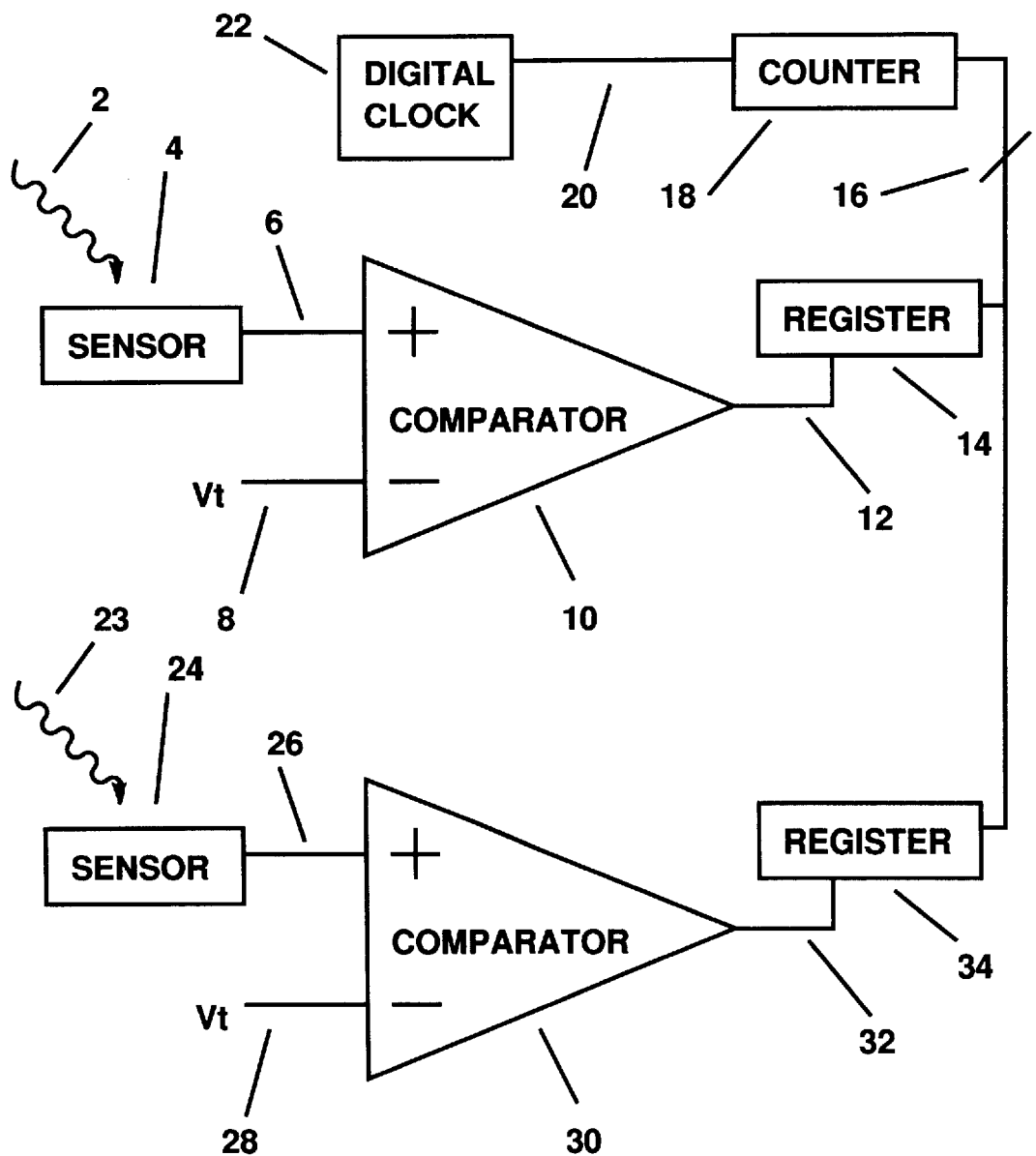
FIG. 2 shows an embodiment of the invention with a digital clock, two comparators, two digital registers, and one shared counter for converting the outputs of two sensors to digital number values.

It is possible to reduce the power consumption due to the switching digital circuitry of counters by sharing the counters among two or more sensors. FIG. 2 shows an embodiment of the invention in which two sensors share a single counter.

In FIG. 2, there are a first sensor 4 and a second sensor 24. A first sensor output 6 of first sensor 4 is applied to the non-inverting input of a first comparator 10. A second sensor output 26 of second sensor 24 is applied to the non-inverting input of a second comparator 30. A voltage indicating a first threshold level 8 and a voltage indicating a second threshold level 28 are applied to the respective inverting inputs of the two comparators. As shown in FIG. 2, these two threshold levels can be the same, in which case a reference source for the threshold levels can be shared among several different sensor output conversion circuits.

First comparator 10 provides a first comparator output 12 which is a control signal for a first digital register 14. Second comparator 30 provides a second comparator output 32 which is a control signal for first digital register 34. Both first digital register 14 and second digital register 34 have as inputs a first counter output 16 which is provided by a first counter 18. First counter 18 is driven by a first digital clock signal 20 provided by a first digital clock 22.

During a full acquisition and A/D conversion, first sensor 4 and second sensor 24 have their outputs initialized to zero, and first counter 18 has first counter output 16 initialized to zero. Then, first sensor 4 is exposed to incident energy 2, and second sensor 24 is exposed to incident energy 23. In response to incident energy 2, first sensor output 6 increases until it reaches first threshold level 8. Then, first comparator output 12 changes, triggering first digital register 14 to record a first value of first counter output 16. At the same time, second sensor output 26 increases in response to incident energy 23. When second sensor output 26 reaches second threshold level 28, second comparator output 32 changes, triggering second digital register 34 to record a second value of first counter output 16.

The first value of first counter output 16 may be greater than, less than, or equal to the second value of first counter output 16. There is know way of knowing in advance which will be the case. This is why first counter output 16 is not disabled. At the end of a maximum desired exposure time, there can be a control signal which causes any registers which have not yet recorded a value of first counter output 16 to acquire a final value of first counter output 16.

Again for purposes of comparison, a 1200 by 1700 element sensor array employing the embodiment of the invention in FIG. 1 would require 2040000 comparators, 2040000 registers, and up to 2040000 threshold reference sources. There would also have to be one or more counters driving the bus lines on which counter outputs are delivered to digital register inputs. The registers which are used for recording in place of counters may or may not require less chip space than the counters, but they certainly use less power in CMOS implementations, since they change only once during an acquisition cycle.

Ultimately, one would expect particularly efficient implementations of the present invention to be sensor arrays with massively parallel shared A/D conversion. The array would have one or more shared counters, one or more shared threshold reference sources, and possibly some shared control lines. Each sensor then requires only its own comparator and digital register.

DESCRIPTION—SOME APPLICATIONS

The present invention would be most useful in CMOS imaging sensor arrays, or in arrays of other sensors where it is possible to simultaneously fabricate sensors and processing circuitry. An advantage of having simple non-shared circuitry is that each sensor and its associated conversion circuitry can be fabricated close to each other, with an array comprising replicated standard blocks. Shared circuitry helps to reduce power consumption and required chip space in large sensor arrays.

The invention can be used in digital imaging systems such as digital cameras and digital video cameras. Such cameras are common consumer electronics products for digital imaging with visible light. The invention can also be used with digital cameras and digital video cameras that acquire images of infrared radiation, ultraviolet radiation, or other forms of non-visible electromagnetic radiation.

The invention can be used in digital imaging systems which use acoustic energy or pressure waves for illumination. For instance, the invention can be used in ultrasound medical imaging arrays or in underwater sonar arrays.

Another interesting application of the invention is in chemical or biological sensor arrays, or "labs on a chip". A chemical or biological sensor array might be used to track plumes of airborne or waterborne chemicals or biological agents. These could be pollutants, weapons, or tracer molecules, and the array could be used to locate the source of the chemicals or biological agents.

In "lab on a chip" systems, a single microchip may have an array of different chemical or biological sensors. A sample of a substance to be analyzed is applied simultaneously to all sensors. Chemical, electrochemical, or other reactions take place at each of the sensors. Ultimately, the sensor responses must be measured and converted to digital number values. This can be accomplished using the present invention.

Alternatively, in such areas as gene sequencing, a variety of different samples of a substance—for instance, DNA fragments—are applied to a sensor array. Based on the sensor responses, the samples are identified. Again, the sensor responses are typically analog quantities that must be converted into digital number values, and the present invention might prove very useful in making low-cost "lab on a chip" systems.

CONCLUSION, RAMIFICATIONS, AND SCOPE

The reader will see that the present invention has several advantages over prior art techniques. Using the present invention, it is possible to implement massively-parallel A/D conversion of sensor outputs from a sensor array. It is possible to share some of the conversion circuitry among multiple sensors, which offers the possibility of reduced chip space and power consumption, as well as maintenance of a high fill factor for the array.

Conversion circuitry that is not shared among multiple sensors can be very simple, so that it can be included in close physical proximity to the sensors themselves, even within the array for certain technologies. Also, the non-shared conversion circuitry can be designed for a single sensor, with sensor and non-shared circuitry replicated to make an array of desired size.

The invention is particularly useful in CMOS imaging sensor technologies, wherein it is possible to manufacture both sensors and conversion circuitry simultaneously on a single chip, and wherein manufacturing tolerances for the various proposed circuit elements both analog and digital are well understood.

The description above contains many specific details relating to sensors, A/D conversion techniques, precision, exposure times, incident energy, clock frequencies, array sizes, array geometries, circuit design, conversion rates, threshold levels, and applications. These should not be construed as limiting the scope of the invention, but as illustrating some of the presently preferred embodiments of the invention. The scope of the invention should be determined by the appended claims and their legal equivalents, rather than by the examples given.

I claim:

1. A machine used for digital image acquisition, comprising:
   a. a first counter which provides a first count
   b. a first sensor which provides a first sensor output signal
   c. means for causing said first count to change as a function of time
   d. means for generating a first sensor output signal level change
   e. means for detecting when said first sensor output signal level change reaches a first threshold level
   f. means for measuring a first elapsed count of said first count indicative of the time required for said first sensor output signal level change to reach said first threshold level
      whereby said first elapsed count is a digital value measuring the time required for said first sensor output signal level change to reach said first threshold level.

2. The machine of claim 1 wherein said means for causing said first count to change as a function of time comprises a first digital clock signal governing said first counter.

3. The machine of claim 2 in which said first digital clock signal can have varying frequency, whereby said first count can change at differing rates, whereby the precision of measurement of the time required for said first sensor output signal level change to reach said first threshold level can be adjusted by choosing an appropriate frequency for said digital clock signal and whereby said machine can be used to measure slow changes or rapid changes of said first sensor output signal.

4. The machine of claim 1 wherein said means for generating a first sensor output signal level change comprises means for initializing said first sensor output signal to a known initial first sensor output signal level.

5. The machine of claim 4 in which said known initial first sensor output signal level is zero, after which said first sensor output signal level change is simply the first sensor output signal level.

6. The machine of claim 5 in which said means for detecting when said first sensor output signal level change reaches said first threshold level comprises a first comparator having:
   a. as a first input said first sensor output signal
   b. as a second input said first threshold level whereby said first sensor output signal level change is said first sensor output signal at any given time, and whereby said first sensor output signal level change can be compared directly to said first threshold level.

7. The machine of claim 4 in which said means for detecting when said first sensor output signal level change reaches said first threshold level comprises a first comparator having:
 a. as a first input said first sensor output signal
 b. as a second input said first threshold level
   whereby said first sensor output signal level change is said first sensor output signal at any given time, and whereby said first sensor output signal level change can be compared directly to said first threshold level, which represents a desired level of change and also said known initial first sensor output signal level.

8. The machine of claim 1 in which:
 a. said means for detecting when said first sensor output signal level change reaches said first threshold level comprises a first comparator which produces a first comparator output
 b. said first comparator output signals said means for measuring said first elapsed count
   whereby a simple device with analog inputs and a digital output can be used to control said means for measuring said first elapsed count.

9. The machine of claim 1 in which said first threshold level depends on said first sensor output signal.

10. The machine of claim 9 in which said first threshold level depends on the level of said first sensor output signal before said first sensor output signal level change, whereby it is possible to use differential signal levels rather than absolute signal levels, whereby it is not always necessary to initialize said first sensor output signal to a known initial output level.

11. The machine of claim 1 in which said means for measuring said first elapsed count comprises:
 a. means for initializing the value of said first count to a first initial count
 b. means for recording the value of said first count as a first final count when said first sensor output signal level change reaches said first threshold level
   whereby said first elapsed count can be the difference between said first final count and said first initial count.

12. The machine of claim 11 in which said first initial count is zero, whereby said first final count is said first elapsed count.

13. The machine of claim 11 in which said means for recording the value of said first count as said first final count is a first digital register, whereby said first count can continue to change as a function of time.

14. The machine of claim 11 in which said means for recording the value of said first count as said first final count is said first counter itself, with recording made possible by preventing said first count from changing with time once said first sensor output signal level change reaches said first threshold level.

15. The machine of claim 1 in which said means for measuring said first elapsed count comprises:
 a. means for recording the value of said first count as a first initial count
 b. means for recording the value of said first count as a first final count when said first sensor output signal level change reaches said first threshold level
   whereby said first elapsed time can be the difference between said first final count and said first initial count, and whereby said first counter does not require initialization.

16. The machine of claim 15 in which said means for recording the value of said first count as said first final count is a first digital register, whereby said first count can continue to change as a function of time.

17. The machine of claim 15 in which said means for recording the value of said first count as said first final count is said first counter itself, with recording made possible by preventing said first count from changing with time once said first sensor output signal level change reaches said first threshold level.

18. The machine of claim 1 further including:
 a. a second sensor which provides a second sensor output signal
 b. means for generating a second sensor output signal level change
 c. means for detecting when said second sensor output signal level change reaches a second threshold level
 d. means for measuring a second elapsed count of said first count indicative of the time required for said second sensor output signal level change to reach said second threshold level
   whereby said second elapsed count is a digital value measuring the time required for said second sensor output signal level change to reach said second threshold level, and whereby said first counter is shared when measuring said first elapsed count and said second elapsed count.

19. The machine of claim 18 in which:
 a. said means for generating said first sensor output signal level change comprises means for initializing said first sensor output signal to a known initial first sensor output signal level
 b. said means for generating said second sensor output signal level change comprises means for initializing said second sensor output to a known initial second sensor output signal level
   whereby said first sensor output signal and said second sensor output signal can be set to known values prior to allowing the output signals to change.

20. The machine of claim 19 in which said known initial first sensor output signal level is the same as said known initial second sensor output signal level.

21. The machine of claim 18 in which said first threshold level has the same value as said second threshold level, whereby said first means for detecting when said first sensor output signal level change reaches said first threshold level and said means for detecting when said second sensor output signal level change reaches a second threshold level can have the same structure, so that said first elapsed count and said second elapsed count can be measurements of the time required for the same amount of change in each sensor's output.

22. The machine of claim 18 in which:
 a. said means for detecting when said first sensor output signal level change reaches said first threshold level comprises a first comparator which produces a first comparator output
 b. said first comparator output signals said means for measuring said first elapsed count
 c. said means for detecting when said second sensor output signal level change reaches said second threshold level comprises a second comparator which produces a second comparator output
 d. said second comparator output signals said means for measuring said second elapsed count whereby simple devices with analog inputs and digital outputs can be used to control said means for measuring said first elapsed count and to control said means for measuring said second elapsed count.

23. The machine of claim 18 in which:
a. said means for measuring said first elapsed count of said first count comprises first means for recording the value of said first count when said first sensor output signal level change reaches said first threshold level, said first means comprising a first digital register
b. said means for measuring said second elapsed count of said first count comprises second means for recording the value of said first count when said second sensor output signal level change reaches said second threshold level, said second means comprising a second digital register
whereby said first count can be used to produce said first elapsed count, said second elapsed count, and elapsed counts for other sensor output signal level changes as well.

24. The machine of claim 23 further including means for compensating for relative routing delay between said means for measuring said first elapsed count and said means for measuring said second elapsed count, whereby routing delays longer than the smallest time interval between counts can be corrected using knowledge of the physical parameters of hardware implementations of said first counter, the sensors, the generating means, the detecting means, and the measuring means.

25. The machine of claim 24 in which said means for compensating for said relative routing delay comprises addition or subtraction of a compensation count from the value recorded by said second means for recording the value of said first count, whereby said value recorded by said second means for recording the value of said first count is corrected relative to the value recorded by said first means for recording the value of said first count.

26. The machine of claim 1, further including:
a. a second counter which provides a second count
b. a second sensor which provides a second sensor output signal
c. means for causing said second count to change as a function of time
d. means for generating a second sensor output signal level change
e. means for detecting when said second sensor output signal level change reaches a second threshold level
f. means for measuring a second elapsed count of said second count indicative of the time required for said second sensor output signal level change to reach said second threshold level
whereby said first elapsed count is a digital value measuring the time required for said first sensor output signal level change to reach said first threshold level, whereby said second elapsed count is a digital value measuring the time required for said second sensor output signal level change to reach said second threshold level, and whereby said first counter and said second counter are not shared when measuring said first elapsed count and said second elapsed count.

27. The machine of claim 26 in which:
a. said means for causing said first count to change as a function of time is a first digital clock signal governing said first counter
b. said means for causing said second count to change as a function of time is a second digital clock signal governing said second counter
c. said first digital clock signal is not the sane digital clock signal as said second digital clock signal
whereby different digital clock signals can govern different counters.

28. The machine of claim 27 in which:
a. said first digital clock signal has a first frequency
b. said second digital clock signal has a second frequency
c. said first frequency is not the same as said second frequency
whereby digital clock signals with different clock signals govern different counters, whereby different counters can be used to simultaneously measure rapid changes in sensor output signals and slow changes in sensor output signals.

29. The machine of claim 26 in which:
a. said means for causing said first count to change as a function of time is a first digital clock signal governing said first counter
b. said means for causing said second count to change as a function of time is said first digital clock signal governing said second counter
whereby the same digital clock signal can govern different counters.

30. The machine of claim 29 further including means for compensating for relative routing delay between said first digital clock signal governing said first counter and said first digital clock signal governing said second counter, whereby relative routing delays longer than the smallest time interval between counts can be corrected using knowledge of the physical parameters of hardware implementations of said first counter, the sensors, the generating means, the detecting means, and the measuring means.

31. The machine of claim 26 in which:
a. said means for measuring said first elapsed count comprises:
i. means for initializing the value of said first count to a first initial count
ii. means for recording the value of said first count as a first final count when said first sensor output signal level change reaches said first threshold level
b. said means for measuring said second elapsed count comprises:
i. means for initializing the value of said second count to a second initial count
ii. means for recording the value of said second count as a second final count when said second sensor output signal level change reaches said second threshold level
whereby said first elapsed count can be the difference between said first final count and said first initial count and whereby said second elapsed count can be the difference between said second final count and said second initial count.

32. The machine of claim 31 in which said first initial count and said second initial count are the same.

33. The machine of claim 32 in which said first initial count is zero, whereby said first final count can be said first elapsed count and said second final count can be said second elapsed count.

34. The machine of claim 32 in which said first initial count and said second initial count are not the same, whereby differing initial counts can be used to compensate for routing delay.

35. The machine of claim 32 in which:
a. said means for recording the value of said first count as said first final count is a first digital register b. said means for recording the value of said second count as said second final count is a second digital register whereby said first count can continue to change as a function of time and whereby said second count can continue to change as a function of time, whereby said first counter and said second counter can be shared among several different conversion circuits.

36. The machine of claim 35 further including means for compensating for relative routing delay comprising arithmetic means for modifying said second final count which is stored in said second digital register, whereby relative routing delays between different counters can be compensated using simple operations such as addition and subtraction.

37. The machine of claim 26 in which:
a. said means for detecting when said first sensor output signal level change reaches said first threshold level comprises a first comparator which produces a first comparator output
b. said means for detecting when said second sensor output signal level change reaches said second threshold level comprises a second comparator which produces a second comparator output
c. said first comparator output signals said means for measuring said first elapsed count
d. said second comparator output signals said means for measuring said second elapsed count whereby simple devices with analog inputs and digital outputs can be used to control said means for measuring said first elapsed count and to control said means for measuring said second elapsed count.

38. The machine of claim 26 in which:
a. said means for measuring said first elapsed count comprises:
   i. means for recording the value of said first count as a first initial count
   ii. means for recording the value of said first count as a first final count when said first sensor output signal level change reaches said first threshold level
b. said means for measuring said second elapsed count comprises:
   i. means for recording the value of said second count as a second initial count
   ii. means for recording the value of said second count as a second final count when said second sensor output signal level change reaches said second threshold level whereby said first elapsed count can be the difference between said first final count and said first initial count and whereby said second elapsed count can be the difference between said second final count and said second initial count.

39. The machine of claim 38 in which:
a. said means for recording the value of said first count as said first final count comprises said first counter itself, with recording made possible by preventing said first count from changing with time once said first sensor output signal level change reaches said first threshold level
b. said means for recording the value of said second count as said second final count comprises said second counter itself, with recording made possible by preventing said second count from changing with time once said second sensor output signal level change reaches said second threshold level whereby said first counter and said second counter keep track of time-varying counts and also record final counts.

40. The machine of claim 38 in which:
a. said means for recording the value of said first count as said first final count comprises a first digital register
b. said means for recording the value of said second count as said second final count comprises a second digital register whereby said first counter and said second counter can be shared among several different conversion circuits.

* * * * *